United States Patent [19]

Chu

[11] Patent Number: 4,988,896
[45] Date of Patent: Jan. 29, 1991

[54] HIGH SPEED CMOS LATCH WITHOUT PASS-GATES

[75] Inventor: Albert M. Chu, Essex Junction, Vt.

[73] Assignee: International Business Machines Corporation, Armonk, N.Y.

[21] Appl. No.: 386,916

[22] Filed: Jul. 31, 1989

[51] Int. Cl.[5] .................... H03K 3/037; H03K 3/356; H03K 19/069; H03K 17/687

[52] U.S. Cl. .................................. 307/452; 307/279; 307/481; 307/290; 377/117

[58] Field of Search ............... 307/279, 288, 289, 290, 307/291, 272.1, 272.2, 272.3, 752, 585, 576, 579, 481; 377/105, 115, 116, 117, 127, 74, 79

[56] References Cited

U.S. PATENT DOCUMENTS

| | | | |
|---|---|---|---|
| 3,619,644 | 11/1971 | Vitter | 307/279 |
| 3,873,852 | 3/1975 | Daniels et al. | 377/117 |
| 4,169,233 | 9/1979 | Harazti | 307/279 X |
| 4,277,699 | 7/1981 | Brown | 307/272.2 |
| 4,394,586 | 7/1983 | Morozumi | 307/452 X |
| 4,568,842 | 2/1986 | Koike | 307/279 |
| 4,654,547 | 3/1987 | Shaver | 307/279 |
| 4,920,282 | 4/1990 | Muraoka et al. | 307/279 X |

OTHER PUBLICATIONS

IBM Technical Disclosure Bulletin, vol. 16, No. 7, Dec. 1973.
IBM Technical Disclosure Bulletin, vol. 27, No. 1B, Jun. 1984.
IBM Technical Disclosure Bulletin, vol. 27, No. 7B, Dec. 1984.
IBM Technical Disclosure Bulletin, vol. 27, No. 10B, Mar. 1985.

Primary Examiner—Stanley D. Miller
Assistant Examiner—David R. Bertelson
Attorney, Agent, or Firm—Sughrue, Mion, Zinn, Macpeak & Seas

[57] ABSTRACT

A high performance latch circuit having complemented isolation means that selectively maintain the state of the latch at a given logic state or input a new logic state thereto. The latch is made up of several legs of series connected translators, the legs being connected in parallel. Selective gating is provided by the transistors directly coupled to the output node.

11 Claims, 5 Drawing Sheets

TIME

HIGH SPEED CMOS LATCH WITHOUT PASS-GATES

FIELD OF THE INVENTION

The present invention relates to a high speed CMOS latch circuit.

BACKGROUND OF THE INVENTION

Many conventional CMOS latch circuits use a pass-gate to clock data into cross-coupled inverters. The term "pass-gate" refers to the function of passing an input signal in response to a control signal applied to the gate of a device. The pass-gate may be either a single NFET device, a single PFET device, or a parallel NFET-PFET pair. In such a conventional latch, the feedback inverter of the cross-coupled inverters must be smaller than the data input inverter so that the data inverter can overdrive the feedback inverter in order to change the state of the latch. The requirement of different sizes for the inverters makes it difficult to implement the latch in a gate array design where only one device size is available.

There are many latch designs available in the prior art. Examples of such prior art latch circuit designs are discussed below.

U.S. Pat. No. 4,277,699 discloses a shift register latch circuit including a polarity hold latch and a set/reset latch. The latches can be clocked with separate non-overlapping clock trains and therefore conform to the so-called Level Sensitive Scan Design (LSSD) rules which enable logic networks embodied in large scale integrated semiconductors to be adequately tested. FIG. 4 of the patent shows how the shift register latch may be implemented with AND/OR/INVERT circuits.

IBM Technical Disclosure Bulletin, Vol. 27, No. 7B, December 1984, pp. 4538-4539 discloses a CMOS LSSD shift register latch which can be implemented in a master slice design without transfer or pass gates to thereby enhance testability. In particular, this reference discloses a two-stage polarity-hold version in which the memory function of the latch is performed by standard CMOS cross-coupled pairs.

IBM Technical Disclosure Bulletin Vol. 27, No. 1B, June 1984, pp. 663-664 discloses a high speed CMOS latch circuit in which clock and data pulses are directly available to the output buffer (CMOS inverter) without first setting the latch.

IBM Technical Bulletin Vol. 27, No. 10B, March 1985, pp. 6098-6099 discloses a LSSD-compatible latch. The latch circuit includes two stages of AND/OR/INVERT circuits controlled by two sets of input controls.

U.S. Pat. No. 4,568,842 discloses a D-Latch CMOS circuit for holding a logic signal in response to a control pulse.

IBM Technical Bulletin Vol. 16, No. 7, December 1973, pp. 2289-2290 discloses a gated inverter using CMOS transistors.

U.S. Pat. No. 3,619,644 discloses a frequency dividing circuit having a logic structure satisfying specified Boolean relationships.

Although various latch circuits are known in the art, it is important to decrease, as much as possible, the amount of current required to change the state of the latch. As discussed above, many latch designs employ data inverters which can overdrive the feedback inverter to change the latch state. With this process a significant amount of device current is needed to force the feedback loop from a first state to a second opposite state. Since the switching speed is proportional to the load provided between the inverter nodes of the latch, a large load will decrease the switching speed of the latch. With increasing levels of integration, this is becoming increasingly important. More particularly, as levels of integration increase, so does the number of latches required to switch in a given cycle.

SUMMARY OF THE INVENTION

In view of the above, a primary object of the present invention is to produce a high speed CMOS latch.

Another object of the invention is to provide a high speed CMOS latch which does not include pass-gates.

Another object of the invention is to provide a high speed CMOS latch having reduced switching current requirements.

A still further object of the invention is to provide a latch circuit which can be easily implemented in a gate array design.

The present invention accomplishes these and other objects by providing a latch circuit which isolates the latch nodes during the clocking cycle so that all of the device current is available to charge the node capacitance. None of the device current is needed to overcome the current drain from other devices in the feedback loop, and therefore the latch requires less current when changing states.

The latch circuit according to the present invention includes:

first and second potential terminals;

first and second MOS transistors of a first type connected in series to form a first pair of transistors;

third and fourth MOS transistors of the first type connected in series to form a second pair of transistors, the first and second pairs of transistors being connected in parallel with each other between the first potential terminal and a first node;

fifth and sixth MOS transistors of a second type which is different from the first type, the fifth and sixth transistors being connected in series to form a third pair of transistors;

seventh and eighth MOS transistors of the second type connected in series to form a fourth pair of transistors, the third and fourth pairs of transistors being connected in parallel between the first node and the second potential terminal;

inverse logic means for receiving a logic voltage at the first node, and for outputting a logic voltage at a second node which the inverse of the logic voltage at the first node;

the gates of the first and sixth transistors being connected to the second node, the gates of the third and eighth transistors being supplied with a data signal, the gates of the second and seventh transistors being supplied with a first clock signal, and the gates of the fourth and fifth transistors being supplied with a second clock signal which has a phase which is opposite to the phase of the first clock signal.

DETAILED DESCRIPTION OF THE PREFERRED EMBODIMENTS

Figure 1:
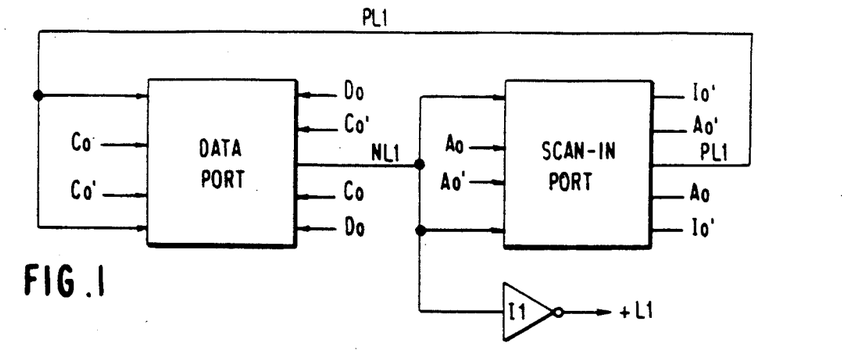
FIG. 1 is a general block diagram of the latch circuit according to the present invention.

FIG. 1 shows a general block diagram of a CMOS latch circuit $L_1$ according to the present invention and, in particular, a polarity hold latch circuit implementation of the invention. The latch circuit $L_1$ includes a Data Port, a Scan-in Port and an Inverter $I_1$.

The Data Port receives a data clock signal Co, an inverted data clock signal Co', a data signal Do and the output $PL_1$ of the Scan-in Port. The Scan-in Port receives the output signal (node NL1) of the Data Port, a scan-in clock signal Ao, the inverse Ao' of the scan-in clock signal, and the inverse Io' of the scan-in signal.

The latch circuit $L_1$ also includes an inverter $I_1$ connected to the output node $NL_1$ of the Data Port. The output $+L_1$ of the inverter $I_1$ represents the output of the CMOS Latch $L_1$.

Figure 2:
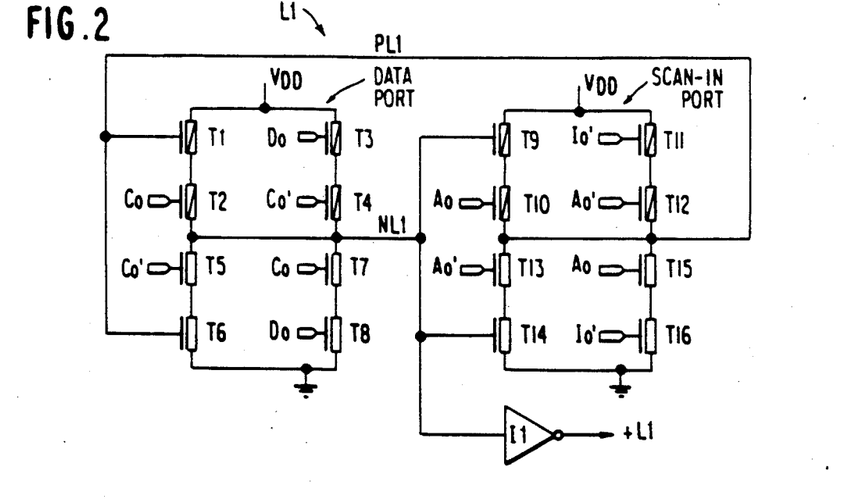
FIG. 2 is a circuit schematic diagram of the latch circuit of FIG. 1.

FIG. 2 shows the circuit diagram of the latch circuit $L_1$ of FIG. 1. As shown in FIG. 2, transistors T1–T8 form the Data Port, and transistors T9–T16 form the Scan-in Port. In this implementation, the Data Port and the Scan-in Port each includes eight MOS transistors, four of which are N-type and four of which are P-type. The transistors T1–T4 and T9–T12 of the Data Port and the Scan-in Port, respectively, are N-type. The transistors T5–T8 and T13–T16 of the Data Port and the Scan-in Port, respectively, are N-type.

The gates of transistors T1 and T6 of the Data Port receive the output signal PL1 of the Scan-in Port. The gates of transistors T2 and T7 receive the clock signal Co, the gates of transistors T4 and T5 receive the inverted clock signal Co', and the gates of transistors T3 and T8 receive the data signal Do.

The P-type transistors T1 and T2 are connected in series between a voltage source terminal $V_{DD}$ and the output node NL1 of the Data Port. The N-type transistors T5 and T6 are connected in series between the output node NL1 and ground GND.

The P-type transistors T3–T4 are connected in the series between source $V_{DD}$ and the output node NL1, and are connected in parallel with the P-type transistors T1–T2 between source $V_{DD}$ and node NL1. The N-type transistors T7–T8 are connected in series between output node NL1 and ground terminal GND, and are connected in parallel with N-type transistors T5–T6 between node NL1 and ground GND.

The gates of transistors T9 and T14 of the Scan-in Port are each connected to the output node NL1 of the Data Port. The gates of transistors T10 and T15 receive the scan-in clock signal Ao, and transistors T12–T13 receive the inverted scan-in clock signal Ao'. The gates of transistors T11 and T16 receive the inverted scan-in data Io'.

The transistors T9–T16 of the Scan-in Port are connected in a similar manner as the transistors T1–T8 of the Data Port. As shown in FIG. 2, the output note PL1 of the Scan-in Port is connected to the gates of transistors T1 and T6, and the output node NL1 of the Data Port is also connected to the input of the inverter $I_1$.

The operation of the latch circuit of FIG. 2 will now be described with reference to the timing diagram of FIG. 3. In particular, the operation will be described with the example of latching a "1" through the Data Port into the Latch L1. In this example, it is assumed that the initial conditions of the latch is such that the latch is in a "0" state (i.e., node NL1 is HIGH and node PL1 is LOW). In the initial condition, both the Ao and Co clock signals are set LOW, and therefore the inverted clock signals Ao' and Co' are both HIGH. With node PL1 and clock signal Co both LOW, P-type transistors T1 and T2 are both on, T5 is on, but T7 is off. As a result, transistors T2 and T5 serve to gate the inversion of PL1 to node NL1, while transistors T4 and T7 are OFF, thereby blocking the input of the data input signal Do. Similarly, with Ao LOW and Ao' HIGH, transistors T10 and T13 of the Scan-in Port are both on which serves to gate the inversion of node NL1 to the PL1 node, while transistors T12 and T15 are OFF, thereby blocking the Io' input. Thus, the Data Port and the Scan-in Port form a cross-coupled inverter pair which serves to hold the L1 latch data.

Figure 3A:
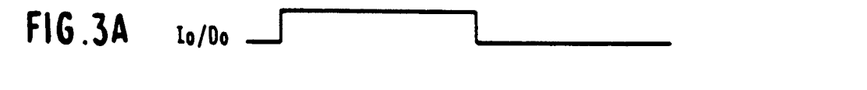
FIGS. 3A–3E are timing diagrams for explaining the operation of the latch circuit of FIG. 2.
Figure 3B:
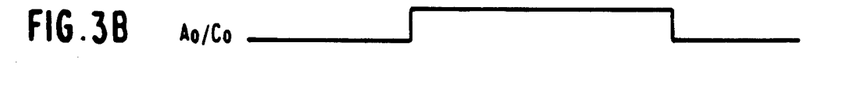
Figure 3C:
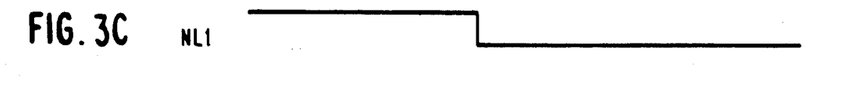

In order to set the L1 Latch to a "1" state, first the data input Do is set HIGH and then the clock signal is set HIGH, as shown in FIGS. 3A and 3B. By setting clock signal Co HIGH, transistors T2 and T5 are turned OFF and transistors T4 and T7 are turned ON, which allows the inversion of the data signal Do' to be gated to node NL1, as shown in FIG. 3C. Since data signal Do is HIGH, transistor T8 is on and transistor T3 is off. Further, since clock signal Co is HIGH, transistor T7 is on. As a result, the voltage at node NL1 is discharged from a HIGH level to a LOW level through the path created by transistors T7 and T8 being on.

As shown in FIG. 3, the same result occurs when inputting scan-in data Io and scan-in clock signal Ao (except that signal PL1 will change state before signal NL1).

Figure 3D:
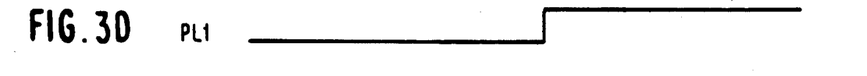
Figure 3E:
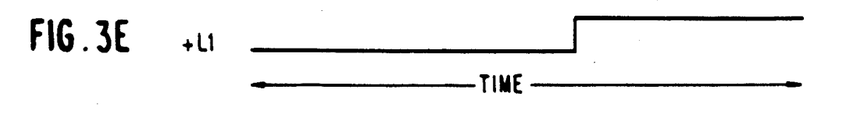

The Scan-in Port acts like an inverter to invert the voltage level at the node NL1, and feed the inverted level back to the Data Port. In particular, the Scan-in Port will invert the low level voltage at node NL1 to a HIGH level at node PL1, as shown in FIG. 3D. The inverter $I_1$ receives the voltage at node NL1 and outputs signal $+L_1$ which represents the output of the latch. Accordingly, when the voltage at node NL1 goes LOW, the output $+L_1$ will go HIGH, as shown in FIG. 3E. As a result, transistors T4 and T7 are off, such that node NL1 is isolated from transistors T3 and T8. At the same time, transistors T2 and T5 are on, such that the voltage on NL1 is controlled by the voltage on PL1, thereby maintaining the state of the L1 latch.

In order to reset the Latch L1 to a "0" state, it is necessary to make the voltage level at node NL1 HIGH. By applying a HIGH or active clock signal Co with a LOW data signal Do, transistors T3–T4 will be turned on, and transistor T5 will be turned OFF. This will cause node NL1 to be charged to a HIGH voltage level because of the path created from source $V_{DD}$ to node NL1 through transistors T3 and T4. As a result of node NL1 going HIGH, the output +L1 will go LOW (i.e., the "0" or reset state).

Figure 4:
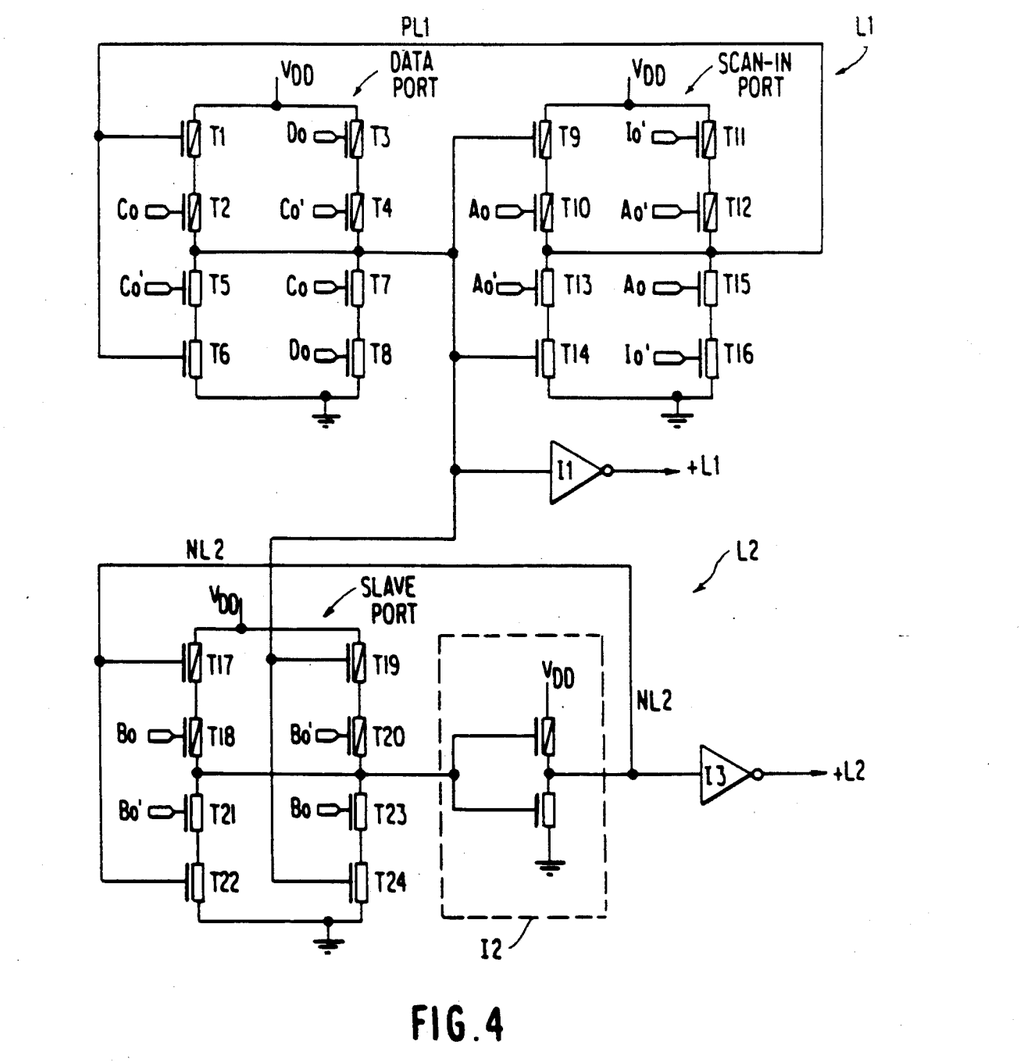
FIG. 4 is a circuit schematic diagram of a Master/-Slave implementation of the latch circuit of FIG. 2.

FIG. 4 shows a latch used in level sensitive scan design (LSSD) testing, which is a master/slave implementation of the latch circuit L1 of FIG. 2. In particular, FIG. 4 includes a second latch L2 which acts as a slave to the master latch L1. Latch L2 includes a Slave Port which is similar in construction to the Data Port and Scan-in Port of latch L1, and inverters I2 and I3. Inverter I2 is connected to receive the output (node PL2) of the Slave Port, and inverter I3 is connected to receive the output of the inverter I2. The output +L2 of inverter I3 serves as the output of Latch L2.

The Slave Port of FIG. 4 includes eight MOS transistor T17-T24, with transistors T17-T20 being P-type, and transistors T21-T24 being N-type.

The gates of transistors T17 and T22 of the Slave Port receive the output NL2 of the inverter I2, and the gates of transistors T18 and T23 receive a clock signal Bo for clocking data from latch L1 to latch L2. The gates of transistors T20 and T21 receive the inverse of this clock signal Bo', and the gates of transistors T19 and T24 are connected to node NL1 of the Data Port of latch L1.

The operation of latch L2 will now be described in connection with the example of latching a "1" from latch L1 to latch L2. In this example, the output +L1 of latch L1 is HIGH, and therefore the node NL1 of latch L1 is LOW. Since the gate of P-type transistor T19 is connected to node NL1, transistor T19 is turned on. In order to latch the output of latch L1 to latch L2, the clock Bo is set HIGH or active, which causes the P-type transistor T20 to turn on since its gate receives the inverse of the latch L2 clock signal Bo'. As a result of transistors T19 and T20 being on, a path is created from voltage source $V_{DD}$ to node PL2 through transistors T19-T20, and node PL2 is charged to a HIGH voltage level. Accordingly, the output of inverter I2 will go LOW and the output +L2 of inverter I3 (i.e., the output of latch L2) goes HIGH (the data of latch L1).

As shown in FIG. 4, the gate of transistor T17 is connected to the output of inverter I2. Accordingly, when the output of inverter I2 is LOW, the P-type transistor T17 is turned on. In order to maintain the data in latch L2, clock Bo is turned off (i.e., clock Bo goes LOW). When clock Bo is LOW, P-type transistor T18 turns on. As a result of transistors T17 and T18 being on, node PL2 is maintained at a HIGH voltage level, and therefore the output +L2 of latch L2 is maintained at a HIGH or "1" level.

Figure 5:
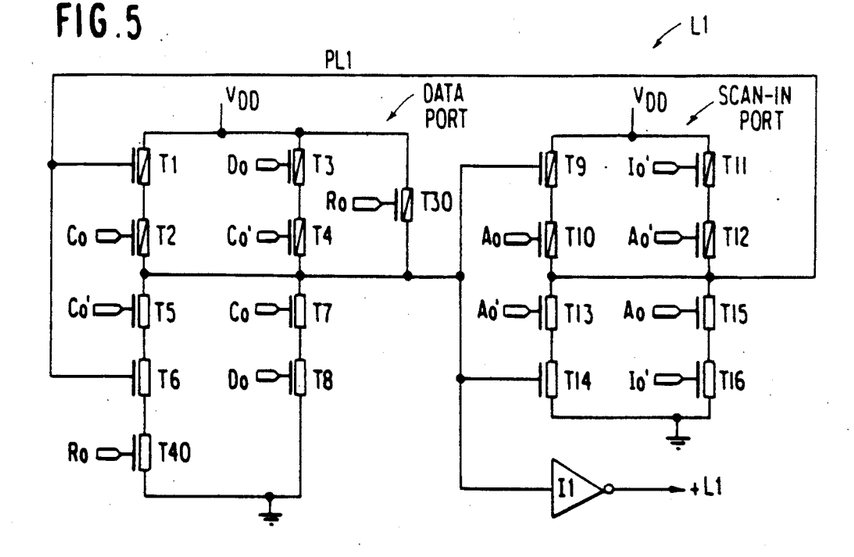
FIG. 5 is a circuit diagram of an embodiment of a latch circuit according to the invention which can reset the latch without the use of a clock signal.

FIG. 5 shows another embodiment of the latch circuit according to the invention. The latch circuit according to this embodiment can reset the L1 latch to a "0" state without the use of a clock signal. The L1 latch shown in FIG. 5 is identical to the L1 latch shown in FIG. 2, except that the Data Port shown in FIG. 5 includes an additional P-type transistor T30 and an additional N-type transistor T40. The P-type transistor T30 is connected between voltage supply $V_{DD}$ and node NL1, and its gate is connected to receive signal Ro. The gate of N-type transistor T40 is also connected to receive signal Ro and this transistor is connected between transistor T6 and ground GND.

As indicated above, the embodiment of FIG. 5 allows the latch L1 to be reset to the "0" state without the use of a clock signal. In particular, this is accomplished by making signal Ro LOW. When signal Ro is LOW, N-type transistor T40 is turned off and P-type transistor T30 is turned on. Since transistor T30 is on, node NL1 will be charged to a HIGH voltage level, thereby causing the output of inverter I1 (i.e., the output +L of latch L1) to be reset to a LOW or "0" state. Accordingly, the embodiment shown in FIG. 5 allows the L1 latch to be reset to a "0" state without the use of a clock signal.

Figure 6:
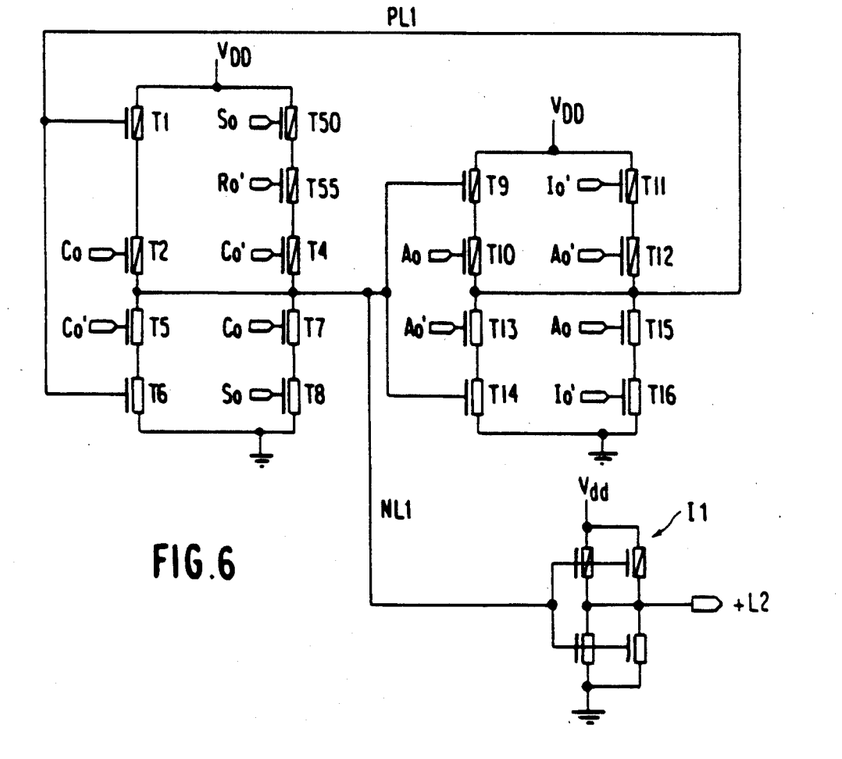
FIG. 6 is a circuit schematic diagram of a Set-Reset Set Dominant Latch according to the present invention.

FIG. 6 shows another embodiment of the latch circuit according to the invention. The latch shown in FIG. 6 may be termed a Set-Reset Set Dominant latch since the latch will be set by a set signal So and reset by a reset signal Ro; however, when both the set and reset signals are applied, the latch will be set. The latch L1 of FIG. 6 is identical to the latch of FIG. 2, except that transistor T3 of FIG. 2 has been replaced with two P-type MOS transistors T50 and T55, and transistor T8 now receives the set signal So.

The gate of transistor T50 receives the set signal So, and the gate of transistor T55 receives the inverse of the reset signal Ro'.

The operation of the latch shown in FIG. 6 will now be described. The latch shown in FIG. 6 is set (i.e., the output of the latch will be set to a "1" or HIGH level) by applying a set signal So and the clock signal Co. In this regard, the setting of the latch shown in FIG. 6 is similar to the operation of latching data signal Do, as discussed in connection with the embodiment of FIG. 2. More particularly, with set signal So and clock signal Co both HIGH, transistor T50 is off, and transistors T7 and T8 are on. As a result, transistor T50 acts as a "blocking transistor" for blocking power from voltage supply $V_{DD}$ to node NL1. Further, because transistors T7 and T8 are both on, a discharge path is created from node NL1 to ground GND. Accordingly, the voltage at NL1 will discharge to ground through transistors T7 and T8, thereby causing inverter I1 to output a "1" or set state. As discussed, the Scan-in Port will act as an inverter to maintain the voltage at node PL1 HIGH, thereby maintaining the voltage at node NL1 LOW and the output +L1 of latch L1 set to a "1" or set condition.

The operation of the resetting reset latch is similar to the operation of setting the latch discussed above. In order to reset the latch, an active (HIGH) reset signal Ro is applied to the latch, along with an active clock signal Co. As will be discussed below, in order to reset the latch, it is necessary for the set signal So to be LOW. With the set signal LOW, and the reset Ro and clock Co signals HIGH, transistors T50, T55 and T4 are all on. Further, transistors T5 and T8 are off. Accordingly, node NL1 would be charged to a HIGH voltage level, thereby causing the output of inverter $L_1$ (i.e., the output of the latch) to be reset to "0" condition.

The latch of FIG. 6 is set dominant in that when both an active set So signal and an active reset Ro signal are applied to latch L1, the latch will be set, not reset. This is because with an active set signal So, transistor T50 will be off, thereby blocking the path between voltage source $V_{DD}$ and node NL1.

Figure 7:
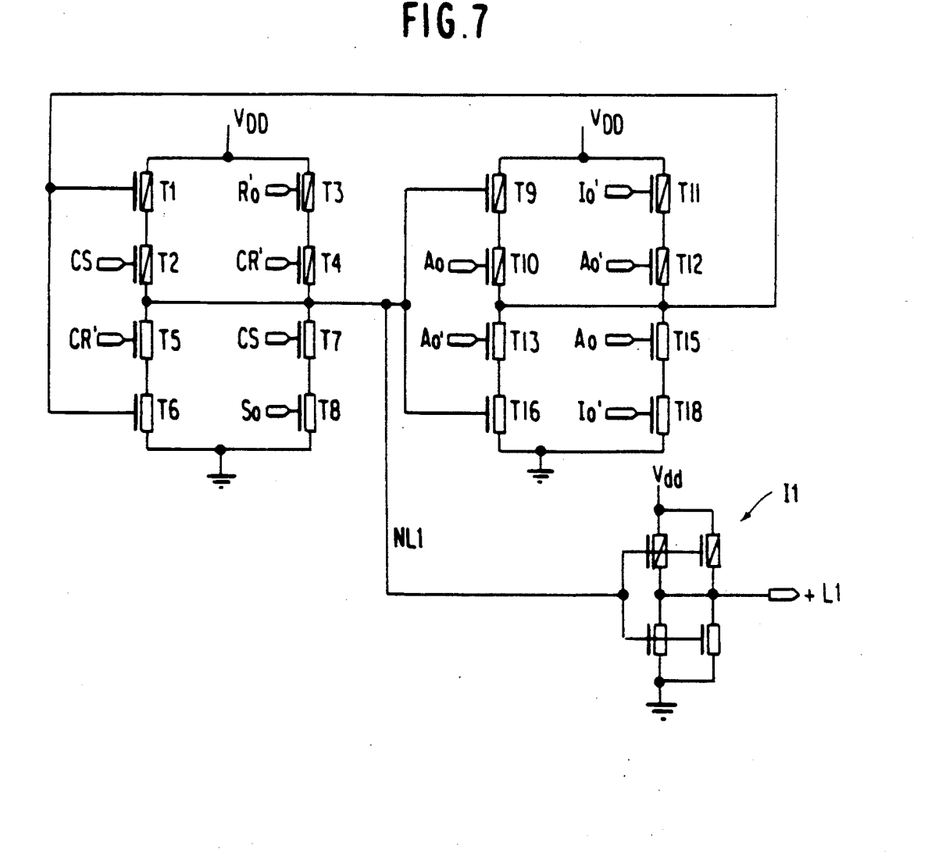
FIG. 7 is a circuit schematic diagram of Set-Reset Double Clock latch according to an embodiment of the present invention.

FIG. 7 shows another embodiment of the latch circuit according to the invention. More particularly, FIG. 7 shows the circuit schematic of a Set-Reset Double Clock Latch. This latch uses separate clock signals for setting and resetting the latch. The latch circuit shown in FIG. 7 is identical in construction to the latch circuit shown in FIG. 2, except that the gate of transistor T3 of the Data Port receives the inverse of a reset signal Ro', and the gate of transistor T8 receives a set signal So.

The clock signals CS and CR correspond to a set clock signal and a reset clock signal, respectively.

The operation of this embodiment will now be described, first in connection with setting the latch, and then with resetting the latch.

In order to set the latch (i.e., to a "1" condition or state), first a HIGH or active set signal So is applied, and then a HIGH clock signal Cs is applied. This is similar to the data signal Do and the clock signal Co of FIG. 3. Since the gates of the N-type transistors T7 and T8 receive the clock set signal CS and the set signal So, respectively, both of these transistors will be turned on, thereby forming a discharge path from node NL1 to ground GND. As a result, the voltage at node NL1 will become LOW. Accordingly, the output +L1 of the inverter I₁ will become HIGH or at a set condition.

The operation of resetting the latch is similar to the operation of setting the latch. More particularly, to reset the latch, an active or HIGH reset signal RO and then an active clock reset signal CR is applied. Since the gates of P-type transistors T3 and T4 receive the inverse verse of the reset signal RO' and the inverse of the reset clock signal CR', respectively, both of these transistors will be on, thereby forming a path from voltage source $V_{DD}$ to node NL1. As a result, the voltage at node NL1 will become HIGH, and the output of the inverter I₁ will become LOW. Accordingly, the latch will be reset to a "0" condition.

Figure 8:
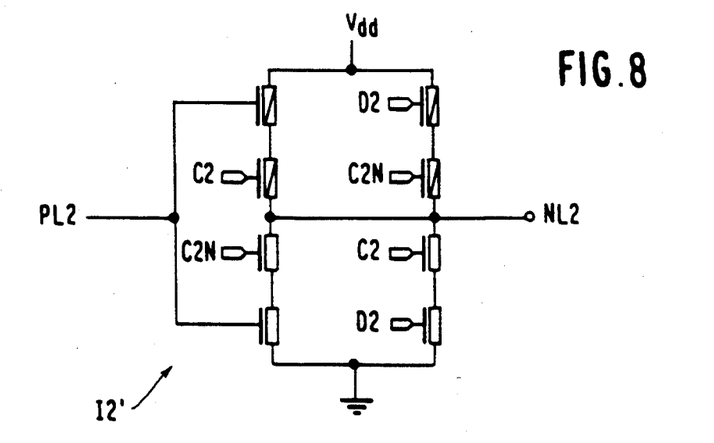
FIG. 8 is a circuit schematic diagram of an inverter I2' that can be substituted for the inverter I2 of the latch L2 of FIG. 4.

FIG. 8 shows an inverter I2' that can be substituted for the inverter I2 of the latch circuit L2 of FIG. 4. The inverter I2' of FIG. 8 adds a Data Port between the output node PL2 of the Slave Port and the input NL2. The configuration of the latch circuit shown in FIG. 8 allows for data D2 to be directly inputted into latch L2. This is because the second Data Port acts like an inverter. The operation of the second Data Port is identical to the operation of the Data Port shown in FIG. 2 and therefore will not be described.

Figure 9:
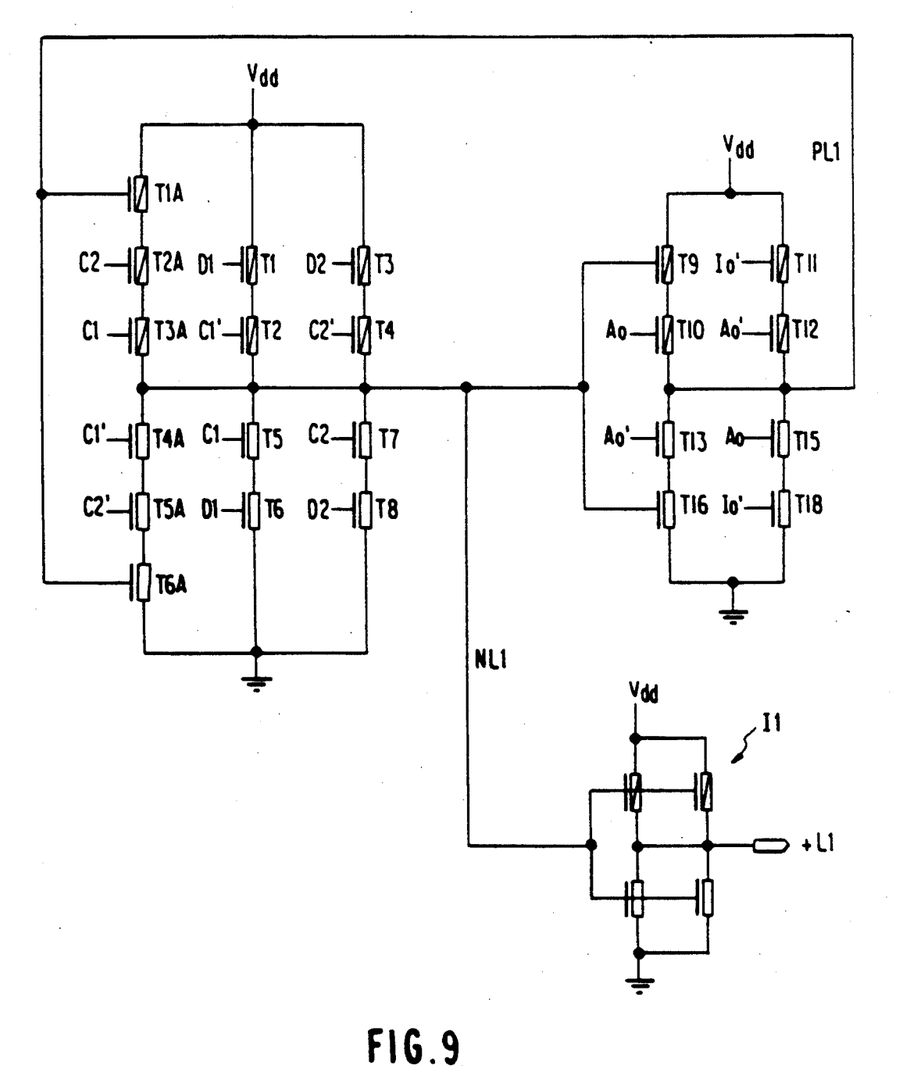
FIG. 9 is circuit schematic diagram of an embodiment of a two-data latch according to the invention.

FIG. 9 shows an embodiment of a dual port latch circuit according to the invention. In this embodiment, either data D1 or data D2 can be applied to the latch L1.

As shown in FIG. 9, the Data Port according to this embodiment includes fourteen transistors T1-T8 and T1A-T6A. The transistors T1-T4 and T1A-T3A are P-type, and transistors T5-T8 and T4A-T6A are N-type.

The operation of applying data D1 with clock signal C1 and of applying data D2 with clock C2 is identical to the operation of applying data Do with clock Co as discussed above in connection with FIGS. 2-3, and therefore this operation will not be described.

While several embodiments of the invention have been described above, other embodiments of this invention would be obvious to those skilled in the logic design art in view of the above description. The above description therefore is intended to be illustrative only and not limiting.

What is claimed is:

1. A latch circuit, comprising
   first and second potential terminals;
   first and second MOS transistors of a first type connected in series to form a first pair of transistors;
   third and fourth MOS transistors of the first type connected in series to form a second pair of transistors, said first and second pairs of transistors being connected in parallel with each other between the first potential terminal and a first node;
   fifth and sixth MOS transistors of a second type which is different from the first type, said fifth and sixth transistors being connected in series to form a third pair of transistors;
   seventh and eighth MOS transistors of the second type connected in series to form a fourth pair of transistors, said third and fourth pairs of transistors being connected in parallel between the first node and the second potential terminal;
   inverse logic means for receiving a logic voltage at the first node, and for outputting a logic voltage at a second node which is the inverse of the logic voltage at the first node; and
   an invertor having its input connected to the first node, and its output representing an output of the latch circuit;
   the gates of said first and sixth transistors receiving the inverse of a voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal.

2. The latch circuit as defined in claim 1 wherein the the logic signal is a data signal which is to be latched.

3. A latch circuit, comprising
   first and second potential terminals;
   first and second MOS transistors of a first type connected in series to form a first pair of transistors;
   third and fourth MOS transistors of the first type connected in series to form a second pair of transistors, said first and second pairs of transistors being connected in parallel with each other between the first potential terminal and a first node;
   fifth and sixth MOS transistors of a second type which is different from the first type, said fifth and sixth transistors being connected in series to form a third pair of transistors;
   seventh and eighth MOS transistors of the second type connected in series to form a fourth pair of transistors, said third and fourth pairs of transistors being connected in parallel between the first node and the second potential terminal;
   the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;
   inverse logic means for receiving a logic voltage at the first node, and for outputting a logic voltage at a second node which is the inverse of the logic voltage at the first node;
   ninth and tenth MOS transistors of the first type connected in series to form a fifth pair of transistors;
   eleventh and twelfth MOS transistors of the first type connected in series to form a sixth pair of transistors, said fifth and sixth pairs of transistors being connected in parallel with each other between the first potential terminal and the second node;
   thirteenth and fourteenth MOS transistors of the second type, said thirteenth and fourteenth transistors being connected in series to form a seventh pair of transistors; and fifteenth and sixteenth MOS transistors of the second type connected in series to form an eighth pair of transistors, said seventh and eighth pairs of transistors being connected in parallel between the second node and the second potential terminal;

the gates of said ninth and fourteenth transistors being connected to the first node, the gates of said eleventh and sixteenth transistors being connected to receive the complement of a second logic signal, the gates of said tenth and fifteenth transistors being connected to receive a third clock signal, and the gates of the twelfth and thirteenth transistors being connected to receive a fourth clock signal having a phase opposite to the phase of the third clock signal.

4. A latch circuit, comprising
first and second potential terminals;
first and second MOS transistors of a first type connected in series to form a first pair of transistors;
third and fourth MOS transistors of the first type connected in series to form a second pair of transistors, said first and second pairs of transistors being connected in parallel with each other between the first potential terminal and a first node;
fifth and sixth MOS transistors of a second type which is different from the first type, said fifth and sixth transistors being connected in series to form a third pair of transistors;
seventh and eighth MOS transistors of the second type connected in series to form a fourth pair of transistors, said third and fourth pairs of transistors being connected in parallel between the first node and the second potential terminal;
the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;
a ninth MOS transistor of the first type connected between the first potential terminal and the first node, and a tenth transistor of the second type connected between the sixth transistor and the second potential terminal, the gates of said ninth and tenth transistors being connected to receive a reset signal for resetting the latch circuit.

5. A latch circuit, comprising
first and second potential terminals;
first and second MOS transistors of a first type connected in series to form a first pair of transistors;
third and fourth MOS transistors of the first type connected in series to form a second pair of transistors, said first and second pairs of transistors being connected in parallel with each other between the first potential terminal and a first node;
fifth and sixth MOS transistors of a second type which is different from the first type, said fifth and sixth transistors being connected in series to form a third pair of transistors;
seventh and eighth MOS transistors of the second type connected in series to form a fourth pair of transistors, said third and fourth pairs of transistors being connected in parallel between the first node and the second potential terminal;
the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;
a ninth, tenth and eleventh MOS transistors of the first type, and twelfth, thirteenth and fourteenth MOS transistors of the second type, the ninth transistor being connected between said first and second transistors, said tenth and eleventh transistors being connected in series between the first potential terminal and the first node, the twelfth transistor being connected between said fifth and sixth transistors, the thirteenth and fourteenth transistors being connected in series between the first node and the second potential terminal, the gates of the ninth and thirteenth transistors being connected to receive a third clock signal, the gates of said tenth and fourteenth transistors being connected to receive a second logic signal, and the gates of said eleventh and twelfth transistors being connected to receive a fourth clock signal having a phase opposite to the phase of the third clock signal.

6. A latch circuit, comprising
first and second potential terminals;
first and second MOS transistors of a first type connected in series to form a first pair of transistors;
third and fourth MOS transistors of the first type connected in series to form a second pair of transistors, said first and second pairs of transistors being connected in parallel with each other between the first potential terminal and a first node;
fifth and sixth MOS transistors of a second type which is different from the first type, said fifth and sixth transistors being connected in series to form a third pair of transistors;
seventh and eighth MOS transistors of the second type connected in series to form a fourth pair of transistors, said third and fourth pairs of transistors being connected in parallel between the first node and the second potential terminal;
the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;
a ninth MOS transistor of the first type connected between said third and fourth transistors, the gate of said ninth transistor being connected to receive the complement of a reset signal for the latch circuit, wherein said first logic signal is a set signal for setting the latch circuit, and wherein the latch circuit is operable for setting the latch when applying active set and clock signals, for resetting the latch when applying active reset and clock signals, and for setting the latch when applying active set, reset and clock signals.

7. A latch circuit, comprising:

first and second potential terminals;

first and second MOS transistors of a first type connected in series to form a first pair of transistors;

third and fourth MOS transistors of the first type connected in series to form a second pair of transistors, said first and second pairs of transistors being connected in parallel with each other between the first potential terminal and a first node;

fifth and sixth MOS transistors of a second type which is different from the first type, said fifth and sixth transistors being connected in series to form a third pair of transistors;

seventh and eighth MOS transistors of the second type connected in series to form a fourth pair of transistors, said third and fourth pairs of transistors being connected in parallel between the first node and the second potential terminal;

inverse logic means for receiving a logic voltage at the first node, and for outputting a logic voltage at a second node which is the complement of the logic voltage at the first node; and an invertor having its input connected to the first node and its output representing an output of the latch circuit;

the gates of said first and sixth transistors being connected to the second node, the gates of said third transistor being connected to receive an inverse of a reset signal, the gate of said eighth transistor being connected to receive a set signal, the gates of said second and seventh transistors being connected to receive a first clock signal for the set signal, and the gates of said fourth and fifth transistors being supplied with a second clock signal having a phase opposite to the phase of the first clock signal.

8. A latch circuit, comprising first and second potential terminals;

first and second MOS transistors of a first type connected in series to form a first pair of transistors;

third and fourth MOS transistors of the first type connected in series to form a second pair of transistors, said first and second pairs of transistors being connected in parallel with each other between the first potential terminal and a first node;

fifth and sixth MOS transistors of a second type which is different from the first type, said fifth and sixth transistors being connected in series to form a third pair of transistors;

seventh and eighth MOS transistors of the second type connected in series to form a fourth pair of transistors, said third and fourth pairs of transistors being connected in parallel between the first node and the second potential terminal;

the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;

inverse logic means for receiving a logic voltage at the first node, and for outputting a logic voltage at a second node which is the inverse of the logic voltage at the first node;

ninth and tenth MOS transistors of the first type connected in series to form a fifth pair of transistors;

eleventh and twelfth MOS transistors of the first type connected in series to from a sixth pair of transistors, said first and sixth paris of transistors being connected in parallel with each other between the first potential terminal and a third node;

thirteenth and fourteenth MOS transistors of the second type, said thirteenth and fourteenth transistors being connected in series to form a seventh pair of transistors; and fifteenth and sixteenth MOS transistors of the second type connected in series to form an eighth pair of transistors, said seventh and eighth pairs of transistors being connected in parallel between the third node and the second potential terminal; and an inverter having an input connected to the third node;

the gates of said ninth and fourteenth transistors being connected to receive an output of said inverter, the gates of said eleventh and sixteenth transistors being connected to the first node, the gates of said tenth and fifteenth transistors being connected to receive a third clock signal, and the gates of the twelfth and thirteenth transistors being connected to receive a fourth clock signal having a phase opposite to the phase of the third clock signal.

9. The latch circuit as defined in claim 8, further comprising a second inverter having an input connected to the first node, and a third inverter having an input connected to an output of the first inverter.

10. A latch circuit, comprising first and second potential terminals;

first and second MOS transistors of a first type connected in series to form a first pair of transistors;

third and fourth MOS transistors of the first type connected in series to form a second pair of transistors, said first and second pairs of transistors being connected in parallel with each other between the first potential terminal and a first node;

fifth and sixth MOS transistors of a second type which is different from the first type, said fifth and sixth transistors being connected in series to form a third pair of transistors;

seventh and eighth MOS transistors of the second type connected in series to form a fourth pair of transistors, said third and fourth pairs of transistors being connected in parallel between the first node and the second potential terminal;

the gates of said first and sixth transistors receiving the inverse of the voltage on the first node, the gates of said third and eighth transistors being connected to receive a first logic signal, the gates of said second and seventh transistors being connected to receive a first clock signal, and the gates of said fourth and fifth transistors being connected to receive a second clock signal having a phase opposite to the phase of the first clock signal;

inverse logic means for receiving a logic voltage at the first node, and for outputting a logic voltage at a second node which is the inverse of the logic voltage at the first node;

ninth and tenth MOS transistors of the first type connected in series to form a fifth pair of transistors;

eleventh and twelfth MOS transistors of the first type connected in series to form a sixth pair of transistors, said fifth and sixth pairs of transistors being connected in parallel with each other between the first potential terminal and a third node;

thirteenth and fourteenth MOS transistors of the second type, said thirteenth and fourteenth transistors being connected in series to form a seventh pair of transistors; and fifteenth and sixteenth MOS transistors of the second type connected in series to form an eighth pair of transistors, said seventh and eighth pairs of transistors being connected in parallel between the third node and the second potential terminal;

second inverse logic means for receiving a logic voltage at the third node, and for outputting a logic voltage at a fourth node which is an inverse of the logic voltage at the third node; and an inverter having an input connected to the fourth node;

the gates of said ninth and fourteenth transistors being connected to the fourth node, the gates of said eleventh and sixteenth transistors being connected to the first node, the gates of said tenth and fifteenth transistors being connected to receive a third clock signal, and the gates of the twelfth and thirteenth transistors being connected to receive a fourth clock signal having a phase opposite to the phase of the third clock signal.

11. The latch circuit as defined in claim 10, wherein said second inverse logic means comprises:

seventeenth and eighteenth MOS transistors of the first type connected in series to form a ninth pair of transistors;

nineteenth and twentieth MOS transistors of the first type connected in series to form a tenth pair of transistors, said ninth and tenth pairs of transistors being connected in parallel with each other between the first potential terminal and the fourth node;

twenty-first and twenty-second MOS transistors of the second type, said twenty-first and twenty-second transistors being connected in series to form an eleventh pair of transistors; and twenty-third and twenty-fourth MOS transistors of the second type connected in series to form a twelfth pair of transistors, said eleventh and twelfth pairs of transistors being connected in parallel between the fourth node and the second potential terminal;

the gates of said seventeenth and twenty-second transistors being connected to the third node, the gates of said nineteenth and twenty-fourth transistors being connected to receive a second logic signal, the gates of said eighteenth and twenty-third transistors being connected to receive a fifth clock signal, and the gates of said twentieth and twenty-first transistors being connected to receive a sixth clock signal having a phase opposite to the phase of the fifth clock signal.

* * * * *